United States Patent
Yamada et al.

(10) Patent No.: US 10,777,545 B2
(45) Date of Patent: Sep. 15, 2020

(54) SEMICONDUCTOR DEVICE

(71) Applicant: DENSO CORPORATION, Kariya, Aichi-pref. (JP)

(72) Inventors: Akira Yamada, Kariya (JP); Shinya Sakurai, Kariya (JP); Takashi Nakano, Kariya (JP); Yosuke Kondo, Kariya (JP); Mutsuya Motojima, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/377,563

(22) Filed: Apr. 8, 2019

(65) Prior Publication Data

US 2019/0237457 A1    Aug. 1, 2019

Related U.S. Application Data

(63) Continuation of application No. PCT/JP2017/037892, filed on Oct. 19, 2017.

(30) Foreign Application Priority Data

Nov. 9, 2016    (JP) ................................ 2016-219029

(51) Int. Cl.
     *H01L 27/02*      (2006.01)
     *H01L 29/78*      (2006.01)
     *H01L 29/06*      (2006.01)
     *H01L 29/10*      (2006.01)
     *H01L 21/8234*      (2006.01)
     (Continued)

(52) U.S. Cl.
CPC ........ *H01L 27/0266* (2013.01); *H01L 21/822* (2013.01); *H01L 21/8222* (2013.01); *H01L 21/8234* (2013.01); *H01L 27/0277* (2013.01); *H01L 27/04* (2013.01); *H01L 27/06* (2013.01); *H01L 27/08* (2013.01); *H01L 27/088* (2013.01); *H01L 29/0696* (2013.01); *H01L 29/1095* (2013.01); *H01L 29/7818* (2013.01); *H01L 29/0653* (2013.01); *H01L 29/7835* (2013.01)

(58) Field of Classification Search
CPC ............. H01L 27/0266; H01L 21/8234; H01L 27/0277; H01L 21/8222; H01L 27/08; H01L 21/822; H01L 27/06; H01L 27/04; H01L 27/088; H01L 29/7818; H01L 29/0696; H01L 29/1095; H01L 29/7835; H01L 29/0653

See application file for complete search history.

(56) References Cited

U.S. PATENT DOCUMENTS

| | | | |
|---|---|---|---|
| 2008/0135940 A1* | 6/2008 | Hashigami | H01L 27/092 257/357 |
| 2012/0326235 A1* | 12/2012 | Otsuru | H01L 29/1087 257/355 |
| 2015/0041883 A1* | 2/2015 | Kimura | H01L 29/66659 257/328 |

FOREIGN PATENT DOCUMENTS

WO    WO-2005093842 A1 * 10/2005 ......... H01L 29/1095

* cited by examiner

*Primary Examiner* — Edward Chin
(74) *Attorney, Agent, or Firm* — Posz Law Group, PLC

(57) ABSTRACT

A semiconductor device configures a protection element that protects a protection target element connected between a cathode electrode and an anode electrode when a parasitic transistor configured by a cathode region, a first conductivity type well layer, and a second conductivity type well is turned on and electrical continuity is established between the cathode electrode and the anode electrode. The semiconductor device includes a plurality of body regions in one cell of the protection element, and the plurality of body regions is brought in contact with the cathode electrode.

9 Claims, 5 Drawing Sheets

(51) Int. Cl.
*H01L 21/8222* (2006.01)
*H01L 27/08* (2006.01)
*H01L 21/822* (2006.01)
*H01L 27/06* (2006.01)
*H01L 27/04* (2006.01)
*H01L 27/088* (2006.01)

SEMICONDUCTOR DEVICE

CROSS REFERENCE TO RELATED APPLICATIONS

The present application is a continuation application of International Patent Application No. PCT/JP2017/037892 filed on Oct. 19, 2017, which designated the U.S. and claims the benefit of priority from Japanese Patent Application No. 2016-219029 filed on Nov. 9, 2016. The entire disclosures of all of the above applications are incorporated herein by reference.

TECHNICAL FIELD

The present disclosure relates to a semiconductor device.

BACKGROUND

In a conventional protection element, a grounded-gate MOSFET (GGMOS) is connected in parallel to a MOSFET used as a switching element for supplying an electric power to a load, so as to protect the MOSFET by the GGMOS. In the protection circuit, since the GGMOS connected in parallel to the MOSFET breaks through before the MOSFET, a surge current can be restricted from flowing through the MOSFET by allowing the surge current to flow to the GGMOS, and the MOSFET can be restricted from breakdown.

SUMMARY

The present disclosure provides a semiconductor device configuring a protection element that protects a protection target element connected between a cathode electrode and an anode electrode when a parasitic transistor configured by a cathode region, a first conductivity type well layer, and a second conductivity type well is turned on and electrical continuity is established between the cathode electrode and the anode electrode. The semiconductor device includes a plurality of body regions in one cell of the protection element, and the plurality of body regions is brought in contact with the cathode electrode.

BRIEF DESCRIPTION OF DRAWINGS

Additional objects and advantages of the present disclosure will be more readily apparent from the following detailed description when taken together with the accompanying drawings. In the drawings.

DETAILED DESCRIPTION

Figure 1:
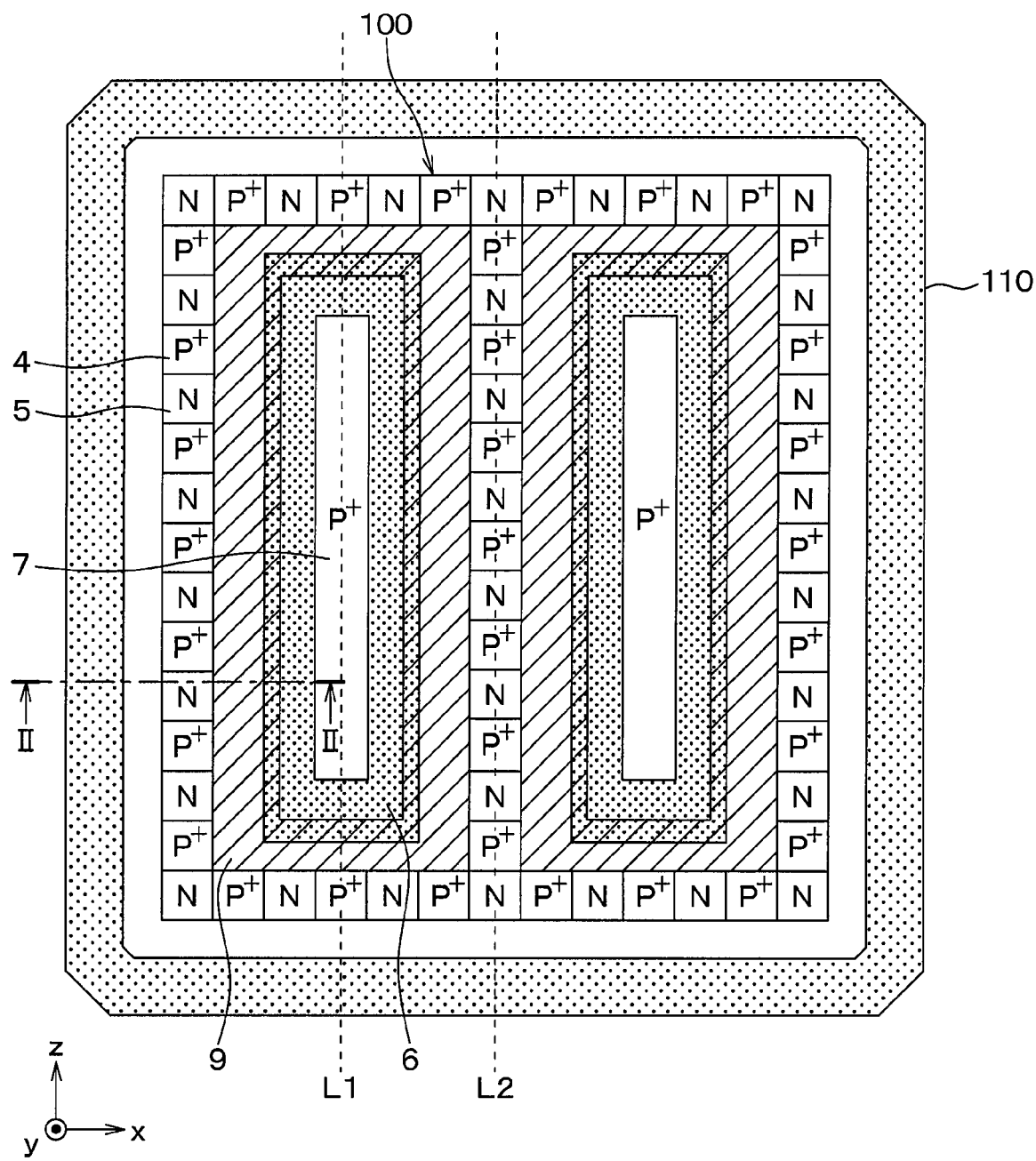
FIG. 1 is diagram showing a planar layout of a semiconductor device including a GGMOS according to a first embodiment.

A semiconductor device according to a related art includes a MOSFET used as a switching element and a GGMOS connected in parallel to the MOSFET. The GGMOS includes a parasitic PNP transistor and a parasitic diode. The parasitic PNP transistor includes an N-type well layer and a P-type well layer which are disposed adjacent to each other, a $P^+$-type cathode region and an $N^+$-type body region which are formed in a surface layer portion of the N-type well layer, and a $P^+$-type anode region which is formed in a surface layer portion of the P-type well layer. The parasitic diode is configured by a PN junction of an N-type well layer and a P-type well layer. The $N^+$-type body region corresponds to a cathode of the parasitic diode, but corresponds to a base of the parasitic PNP transistor. Similarly, the $P^+$-type anode region corresponds to an anode of the parasitic diode, but corresponds to a collector of the parasitic PNP transistor. The $P^+$-type cathode region corresponds to an emitter of the parasitic PNP transistor.

In the above-described configuration, the parasitic diode due to the PN junction between the N-type well layer and the P-type well layer is turned on when a surge is applied. Then, a voltage between the base and cathode of the parasitic transistor rises due to a voltage drop in a base resistance associated with the above operation, that is, an internal resistance of the N-type well layer up to the $N^+$-type body region. Accordingly, the parasitic PNP transistor is turned on and a power is not supplied to the MOSFET used as the switching element. Thus, a surge current can be restricted from flowing through the MOSFET.

However, a voltage in the P-type well layer may rise due to a resistive component of the P-type well layer, may exceed a breakdown voltage of the MOSFET serving as a protection target element, and the protection target element may not be protected. In particular, when the breakdown voltage of the protection element is high, since a drift length, that is, a length of the P-type well layer from a PN junction, which is a boundary with the N-type well layer, to a $P^+$-type anode region is long, a drift resistance is high, and a voltage rise is likely to occur.

In a configuration in which the $N^+$-type body region is formed only on an outer peripheral portion of a cell region where the GGMOS is formed, the distance from the PN junction configured by the N-type well layer and the P-type well layer to the $N^+$-type body layer can be increased, and the base resistance can be increased so that the parasitic PNP transistor can be easily operated. Thus, an excessive voltage can be restricted from being applied to a protection target element.

However, if the position at which the $N^+$-type body region is formed is limited, an operation timing varies between a portion of the GGMOS far from the $N^+$-type body region and a portion of the GGMOS close to the $N^+$-type body region, and the GGMOS cannot be operated uniformly.

A semiconductor device according to a first aspect of the present disclosure configures a protection element, and includes a semiconductor substrate, a cathode region, a plurality of body regions, an anode region, a gate insulating film, a gate electrode, a cathode electrode, and an anode electrode. The semiconductor substrate has a first conductivity type well layer and a second conductivity type well layer being in contact with each other. The cathode region is disposed at a position away from a PN junction configured by the first conductivity type well layer and the second conductivity type well layer in a surface layer portion of the first conductivity type well layer, and has a second conductivity type impurity concentration higher than a second conductivity type impurity concentration of the second conductivity type well layer. The plurality of body regions has a first conductivity type, and is disposed at a plurality of positions different from the cathode region in the surface layer portion of the first conductivity type well layer. The anode region is disposed at a position away from the PN junction in a surface layer portion of the second conductivity type well layer, and has a second conductivity type impurity concentration higher than the second conductivity type impurity concentration of the second conductivity type well layer. The gate insulating film is disposed on a surface of a portion of the second conductivity type well layer located between the cathode region and the anode region. The gate electrode is disposed on the gate insulating film. The cathode electrode is electrically connected to the cathode region and is electrically connected to the first conductivity type well layer through the plurality of body regions. The anode electrode is electrically connected to the anode region. The protection element is configured to protect a protection target element connected between the cathode electrode and the anode electrode when a parasitic transistor configured by the cathode region, the first conductivity type well layer, and the second conductivity type well is turned on and electric continuity is established between the cathode electrode and the anode electrode. The plurality of body regions is disposed in one cell of the protection element, and is brought in Schottky contact with the cathode electrode.

In the semiconductor device according to the first aspect of the present disclosure, the plurality of body regions is disposed in one cell of the GGMOS, and an impurity concentration of the plurality of body regions is set to be low, so that the plurality of body regions is brought into Schottky contact with the cathode electrode. As a result, since a body contact resistance can be increased and a base resistance can be increased, the parasitic PNP transistor can easily operate, and the parasitic transistor can be turned on more quickly. Therefore, a surge current can be accurately restricted from flowing through the protection target element.

A semiconductor device according to a second aspect of the present disclosure configures one cell of a protection element and includes a semiconductor substrate, a cathode region, a plurality of body regions, an anode region, a gate insulating film, a gate electrode, a cathode electrode, and an anode electrode. The semiconductor substrate has a first conductivity type well layer and a second conductivity type well layer being in contact with each other. The cathode region is disposed at a position away from a PN junction configured by the first conductivity type well layer and the second conductivity type well layer in a surface layer portion of the first conductivity type well layer, and has a second conductivity type impurity concentration higher than a second conductivity type impurity concentration of the second conductivity type well layer. The plurality of body regions has a first conductivity type, and is disposed at a plurality of positions different from the cathode region in the surface layer portion of the first conductivity type well layer. The anode region is disposed at a position away from the PN junction in the surface layer portion of the second conductivity type well layer and has the second conductivity type impurity concentration higher than the second conductivity type impurity concentration of the second conductivity type well layer. The gate insulating film is disposed on a surface of a portion of the second conductivity type well layer located between the cathode region and the anode region. The gate electrode is disposed on the gate insulating film. The cathode electrode is electrically connected to the cathode region and is electrically connected to the first conductivity type well layer through the plurality of body regions. The anode electrode is electrically connected to the anode region. The protection element is configured to protect a protection target element connected between the cathode electrode and the anode electrode when a parasitic transistor configured by the cathode region, the first conductivity type well layer, and the second conductivity type well is turned on, and electrical continuity is established between the cathode electrode and the anode electrode. The plurality of body regions is disposed in one cell of the protection element, and each of the plurality of the body regions includes a high resistance layer of the first conductivity type. The high resistance layer is disposed at a position above the first conductivity type well layer, is higher in resistance than the first conductivity type well layer, and is brought in contact with the cathode electrode.

In this manner, even if the high resistance layer is provided in the plurality of body regions, a body contact resistance can be increased. Thus, effects similar to the semiconductor device according to first aspect of the present disclosure can be obtained.

Embodiments of the present disclosure will be described below with reference to the drawings. In the following embodiments, the same reference numerals are assigned to parts that are the same or equivalent to each other for description.

First Embodiment

A first embodiment will be described. A semiconductor device described in the present embodiment configures, in addition to various elements such as a laterally diffused MOSFET (LDMOS), a GGMOS serving as a protection element using the same structure as a structure of the LDMOS. However, since general elements such as the LDMOS are the same as those in a conventional art, the GGMOS will be mainly described.

Figure 2:
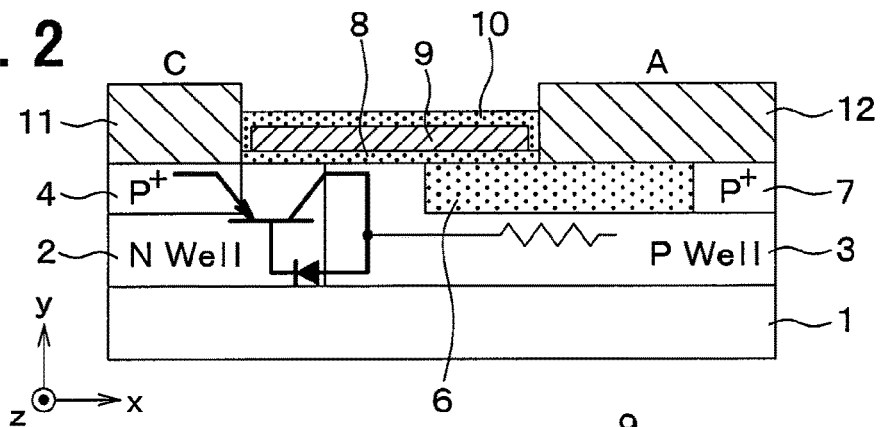
FIG. 2 is a cross-sectional view of the semiconductor device taken along a line II-II in FIG. 1.
Figure 3:
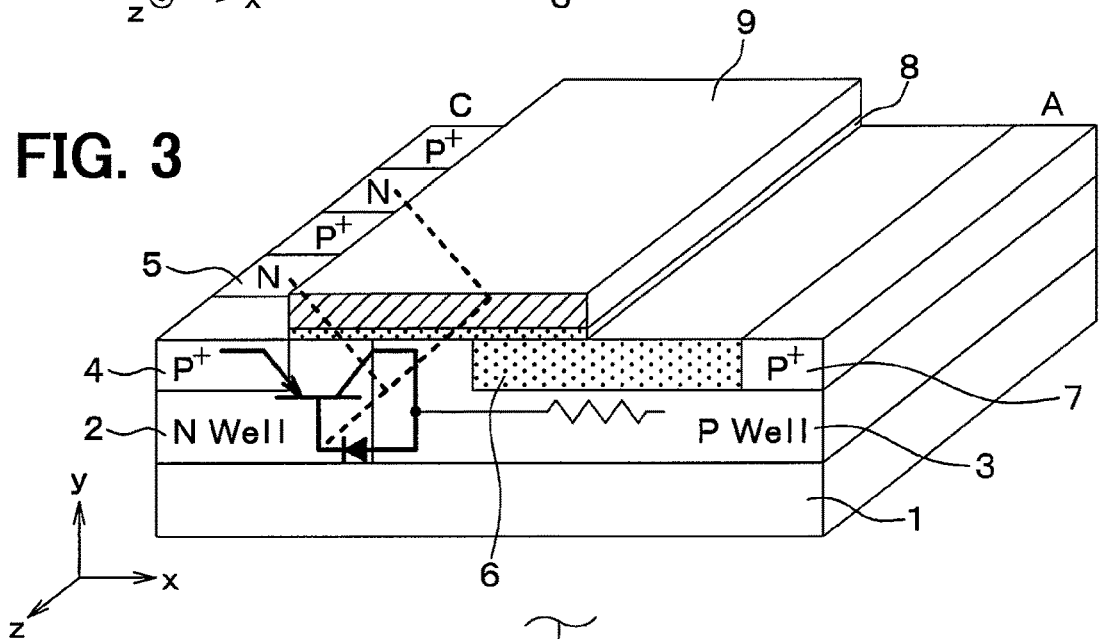
FIG. 3 is a cross-sectional perspective view of the semiconductor device shown in FIG. 2.

The semiconductor device includes a GGMOS 100 having a configuration shown in FIGS. 1 to 3 in addition to the LDMOS which is not shown. The GGMOS 100 has a basic structure same as the LDMOS, is formed on the semiconductor substrate 1 same as the LDMOS, and has the following structure. In the following description, a horizontal direction in a paper of FIGS. 1 and 2 is an x-direction, a normal direction in the paper of FIG. 1 and a vertical direction in the paper of FIG. 2 are a y-direction, and a vertical direction of the paper in FIG. 1, that is, a normal direction to an xy-plane, which is parallel to the paper in FIG. 2, is a z-direction. The x-direction and the z-direction are parallel to a surface of the semiconductor substrate 1 and orthogonal to each other. The y-direction is the normal direction to the surface of the semiconductor substrate 1. FIG. 1 is not a cross-sectional view, but is partially hatched for clarity.

The GGMOS 100 having a structure of FIG. 2 is a half cell, and the structure is laid out in a line symmetric manner across a straight line L1 as shown in FIG. 1 to provide one cell, and the cells are disposed in a line symmetric manner across a straight line L2. Although two cells are illustrated in FIG. 1, a planar layout is schematically illustrated, and two or more cells may be disposed.

As shown in FIG. 2, an N-type well layer 2 and a P-type well layer 3 are formed on a surface layer portion of the semiconductor substrate 1 formed of, for example, a silicon substrate, and are disposed adjacent to each other to configure a PN junction. In the present embodiment, the N-type well layer 2 and the P-type well layer 3 have linear portions extending in the z-direction, and a boundary line of the PN junction configured by the N-type well layer 2 and the P-type well layer 3 also has a linear portion extending along the z-direction.

In the present embodiment, the N-type well layer 2 and the P-type well layer 3 are respectively formed on the semiconductor substrate 1. However, the semiconductor substrate 1 can also be used as the N-type well layer 2 when the semiconductor substrate 1 is formed of an N-type substrate. Alternatively, the semiconductor substrate 1 can also be used as the P-type well layer 3 when the semiconductor substrate 1 is formed of a P-type substrate. Although a simple silicon substrate is used as the semiconductor substrate 1 in the present embodiment, a silicon on insulator (SOI) substrate in which an active layer and a support substrate are insulated from each other by a buried insulating film may also be used as the semiconductor substrate 1. In such a case, the N-type well layer and the P-type well layer 3 are formed in the active layer. When the active layer is configured by an N-type or a P-type, the active layer can function the N-type well layer 2 or the P-type well layer 3.

$P^+$-type cathode regions 4 are formed in a surface layer portion of the N-type well layer 2. The $P^+$-type cathode regions 4 correspond to $P^+$-type source regions in the LDMOS.

The $P^+$-type cathode regions 4 are disposed at positions away from the PN junction, and disposed at least along a boundary line of the PN junction. In the present embodiment, as shown in FIG. 1, two cells in which the GGMOS 100 having a structure of FIGS. 2 and 3 are laid out in a rectangular frame form are disposed side by side across the straight line L2, and the $P^+$-type cathode regions 4 are disposed so as to surround the respective cells.

The $P^+$-type cathode regions 4 are disposed at regular intervals, and the $P^+$-type cathode regions 4 are shared between adjacent cells. Planar shapes of the $P^+$-type cathode regions 4 are, for example, quadrangles, and two sides of the quadrangles are parallel to the boundary line of the PN junction. For example, the $P^+$-type cathode regions 4 have a P-type impurity concentration higher than a P-type impurity concentration of the P-type well layer 3, and the P-type impurity concentration on the surface of the $P^+$-type cathode regions 4 is set to about $9 \times 10^{20}$ cm$^{-3}$.

In addition, N-type body regions 5 are disposed in the surface layer portion of the N-type well layer 2. In the present embodiment, each of the N-type body regions 5 is disposed between the adjacent $P^+$-type cathode regions 4 so as to surround the cell of the GGMOS 100.

The N-type body regions 5 are disposed at regular intervals, and the N-type body regions 5 are shared between the adjacent cells. A planar shape of each N-type body regions 5 is, for example, a quadrangle, and two sides of the quadrangle are parallel to the boundary line of the PN junction. For example, the N-type impurity concentration on the surface of the N-type body regions 5 is set to be about $7 \times 10^{17}$ cm$^{-3}$, which is lower than the $P^+$-type cathode regions 4. Thus, the cathode electrode 11, which will be described later, is brought into ohmic contact with the $P^+$-type cathode regions 4, and is brought into Schottky contact with the N-type body regions 5.

On the other hand, an insulating film 6 is buried in a surface layer portion of the P-type well layer 3. The insulating film 6 is formed at a position away from the PN junction between the N-type well layer 2 and the P-type well layer 3, and extends along the boundary line of the PN junction. For example, the insulating film 6 is formed of a shallow trench isolation (STI) film or a LOCOS oxide film, and is buried so as to penetrate from the surface layer portion of the P-type well layer 3 in a depth direction.

In the P-type well layer 3, a $P^+$-type anode region 7 is formed at a position of the P-type well layer 3 opposed to the N-type well layer 2 across the insulating film 6. The $P^+$-type anode region 7 has a linear planar layout, is formed in parallel with the boundary line of the PN junction, more specifically, along the straight line L1, and is common to the half cells arranged on both sides across the straight line L1. For example, the $P^+$-type anode region 7 has a P-type impurity concentration higher than the P-type impurity concentration of the P-type well layer 3, and the P-type impurity concentration on the surface of the $P^+$-type anode region 7 is set to be about $9 \times 10^{20}$ cm$^{-3}$.

Further, a gate insulating film 8 is formed on surfaces of portions of the N-type well layer 2 and the P-type well layer 3 located between the $P^+$-type cathode region 4, the insulating film 6, and the $P^+$-type anode region 7, and further, a gate electrode 9 is formed on the gate insulating film 8. The gate electrode 9 is applied with a gate voltage when used in the LDMOS, but in the GGMOS 100, the gate electrode 9 is electrically connected to the cathode electrode 11, which will be described later, to provide a source potential, that is, a ground potential.

As shown in FIG. 2, an interlayer insulating film 10 is formed so as to cover the gate electrode 9. Contact holes for exposing the $P^+$-type cathode regions 4 and the N-type body regions 5 are provided in the interlayer insulating film 10, and the $P^+$-type cathode regions 4 and the N-type body regions 5 are electrically connected to the cathode electrode 11 through the contact holes. Further, a contact hole for exposing the $P^+$-type anode region 7 is provided in the interlayer insulating film 10, and the $P^+$-type anode region 7 is electrically connected to the anode electrode 12 through the contact hole.

As shown in FIG. 1, an outer periphery of the cell of the GGMOS 100 is surrounded by an isolation structure 110. The isolation structure 110 is formed of, for example, a trench isolation structure or a PN-junction isolation structure. Since the GGMOS 100 is surrounded by the isolation structure 110, the GGMOS 100 is electrically isolated from other elements.

In the GGMOS 100 configured as described above, the N-type well layer 2 and the P-type well layer 3 are linearly extended in the z-direction. Similarly, the $P^+$-type cathode regions 4 and the multiple N-type body regions 5 are alternately aligned on a straight line in the z-direction, and the $P^+$-type anode region 7 extends linearly in the z-direction. Thus, the cells of the GGMOS 100 are laid out in a stripe.

Figure 4:
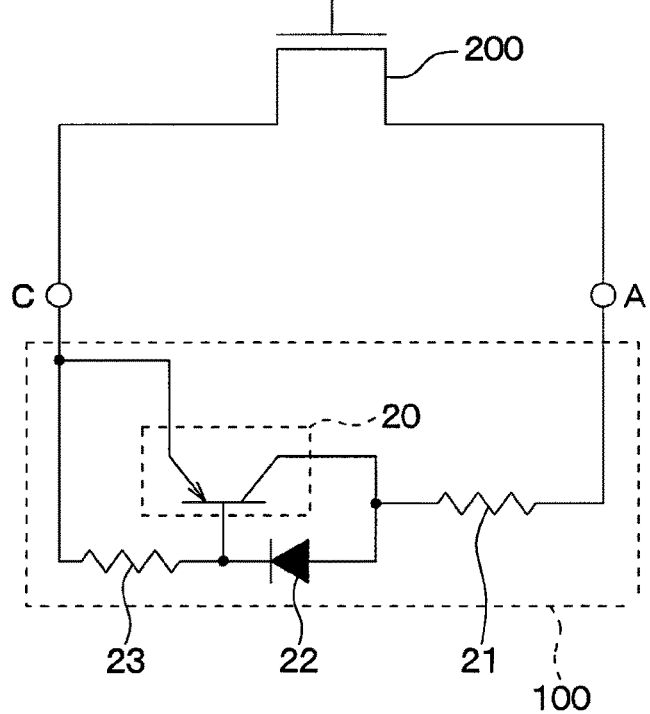
FIG. 4 is an equivalent circuit diagram of the GGMOS used as a protection element according to the first embodiment.

An equivalent circuit of the above-described GGMOS 100 has a circuit configuration shown in FIG. 4. In other words, a parasitic PNP transistor 20 is configured by the PNP junction configured by the $P^+$-type cathode regions 4, the N-type well layer 2, and the P-type well layer 3. In the parasitic PNP transistor, the $P^+$-type cathode regions 4 function as cathodes, in other words, emitters, the N-type well layer 2 functions as a base, and the P-type well layer 3 functions as an anode, in other words, a collector. The $P^+$-type cathode regions 4 are electrically connected to the cathode electrode 11 serving as a cathode terminal (C), and the P-type well layer 3 is electrically connected to an anode electrode 12 serving as an anode terminal (A) through a drift resistor 21 formed by an inner resistor. A diode 22 is configured by a PN junction between the N-type well layer 2 and the P-type well layer 3, and is connected between a base and an anode of the parasitic PNP transistor. Further, a base resistor 23 caused by an internal resistor of the N-type well layer 2 and a body contact resistance between the N-type body regions 5 and the cathode electrode 11 is disposed between the base and the cathode of the parasitic PNP transistor.

Since the gate electrode 9 is set to be the ground potential, the GGMOS 100 is not particularly affected. Thus, the gate electrode 9 is excluded from the circuit configuration in FIG. 4.

In the GGMOS 100 having the circuit configuration described above, for example, as shown in FIG. 4, the anode and the cathode are connected between a drain and a source of an LDMOS 200, to thereby function as a protection element. For example, when a breakdown voltage of the LDMOS 200 is set to a voltage V1, the parasitic PNP transistor 20 is operated with a voltage V2 lower than the voltage V1. More specifically, when the voltage between the anode and the cathode becomes a predetermined value or more, the diode 22 is turned on, a current flows through a path of the drift resistor 21, the diode 22, and the base resistor 23, and a voltage between the cathode and the base of the parasitic PNP transistor 20 rises due to a voltage drop of the base resistor 23 according to the amount of flowing current. As a result, the parasitic PNP transistor 20 is turned on and electrical continuity is established between the cathode and the anode through the parasitic PNP transistor 20. Thus, the surge current can be restricted from flowing through the LDMOS 200 and the LDMOS 200 can be protected from breakdown.

At that time, if the voltage rise in the P-type well layer 3 due to the drift resistor 21 is large, the voltage exceeds the voltage V1 which is the breakdown voltage of the LDMOS 200, and the LDMOS 200 may not be protected. For example, since a distance from the PN junction which is a boundary between the P-type well layer 3 and the N-type well layer 2 to the P+-type anode region 7, that is, the drift length is long, if the drift resistor 21 becomes high, the voltage rises easily and the GGMOS 100 cannot function as an appropriate protection element.

However, in the GGMOS 100 according to the present embodiment, the N-type impurity concentration of the N-type body region 5 is set to a low concentration, and the N-type body region 5 is brought in Schottky contact with the cathode electrode 11. Thus, the body contact resistance becomes high, as a result of which the base resistor 23 becomes high, and the voltage between the cathode and the base rises due to the voltage drop of the base resistor 23. As a result, the parasitic PNP transistor 20 can be turned on more quickly, and the surge current can be accurately restricted from flowing through the LDMOS 200 serving as the protection target element.

As described above, in the semiconductor device according to the present embodiment, the multiple N-type body regions 5 are disposed in one cell of the GGMOS 100, and the N-type impurity concentration of the N-type body regions 5 is set to be low so that the N-type body regions 5 are brought in Schottky contact with the cathode electrode 11. More specifically, the multiple N-type body regions 5 are disposed so as to surround the cell configuring the GGMOS 100. As a result, since the body contact resistance can be increased and the base resistor 23 can be increased, the parasitic PNP transistor 20 can easily operate, and the parasitic PNP transistor 20 can be turned on more quickly. Therefore, a surge current can be accurately restricted from flowing through the protection target element.

Basically, the same manufacturing method as a conventional method can be applied to the method of manufacturing the GGMOS 100 structured as described above. For example, when the N-type body regions 5 are formed by ion implantation, it is only required to set the N-type impurity concentration of the N-type body regions 5 to be low by reducing the dose amount at the time of ion implantation.

Second Embodiment

A second embodiment will be described. The present embodiment is similar to the first embodiment except that a planar layout of the GGMOS 100 is changed as compared with the first embodiment, and therefore only the portions different from the first embodiment will be described.

Figure 5:
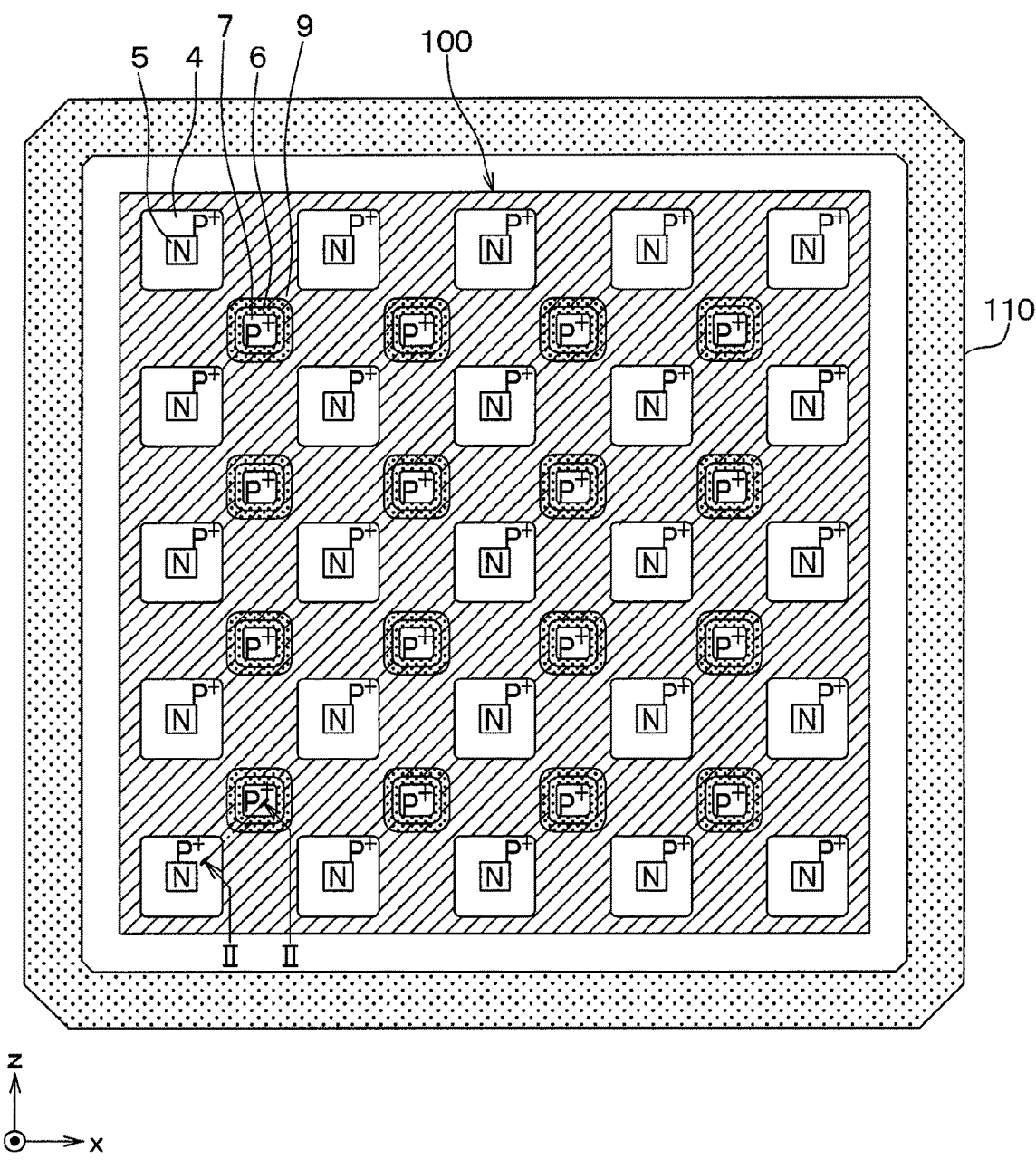
FIG. 5 is a diagram showing a planar layout of a semiconductor device including a GGMOS according to a second embodiment.

As shown in FIG. 5, an N-type body region 5 and a P+-type cathode region 4 disposed concentrically so as to surround the N-type body region 5 are set as one pair, and multiple pairs are disposed in a lattice pattern. In other words, the multiple pairs aligned at regular intervals in the x-direction are set as one set, and multiple sets are disposed at intervals in the z-direction so as to be disposed in the lattice pattern. In FIG. 5, five pairs aligned in the x-direction are set as one set, and five sets are disposed at intervals in the z-direction so that pairs of the N-type body region 5 and the P+-type cathode region 4 are disposed in a 5×5 matrix. However, FIG. 5 only shows the planar layout schematically, and an arrangement of the pairs of the N-type body region 5 and the P+-type cathode region 4 is not limited to a 5×5 matrix.

P+-type anode regions 7 are also disposed in a lattice pattern. More specifically, at positions away from the pairs of the N-type body region 5 and the P+-type cathode region 4, multiple sets of the P+-type anode regions 7 aligned at regular intervals in the x-direction in FIG. 5 are disposed at intervals in the z-direction so as to be disposed in the lattice pattern. More specifically, each of the P+-type anode regions 7 is disposed between four adjacent pairs of the N-type body region 5 and P+-type cathode region 4, that is, the P+-type anode region 7 is disposed at a center position of the four pairs disposed in a square shape. Thus, in FIG. 5, four sets of four P+-type anode regions 7 aligned in the x-direction are disposed at intervals in the z-direction so that the P+-type anode regions 7 are disposed in a 4×4 matrix. However, FIG. 5 only shows the planar layout schematically, and an arrangement of the P+-type anode regions 7 is not limited to the 4×4 matrix.

Then, the insulating film 6 and the gate electrode 9 are disposed so as to fill gaps among the P+-type anode regions 7 and the pairs of the N-type body region 5 and the P+-type cathode region 4 arranged as described above, so that the gate electrode 9 is formed in a mesh pattern. Although not shown in FIG. 5, the N-type well layer 2 is formed at least at positions corresponding to and around the pairs of the N-type body region 5 and the P+-type cathode region 4. Similarly, although not shown in FIG. 5, the P-type well layer 3 is formed at least at positions corresponding to and around at the P-type anode regions 7. One of the N-type well layer 2 and the P-type well layer 3 is formed in a mesh pattern, and the other of the N-type well layer 2 and the P-type well layer 3 is formed at positions of meshes of the mesh pattern. With the configuration described above, a semiconductor device having a GGMOS 100 with a mesh structure is formed. A cross-sectional view taken along a line II-II in FIG. 5 is similar to the cross-sectional view shown in FIG. 2.

As described above, even in the GGMOS 100 having the planar layout in which the P$^+$-type anode regions 7 and the pairs of the N-type body region 5 and the P$^+$-type cathode region 4 are disposed in the lattice pattern, and the gate electrode 9 is formed in the mesh pattern, the cross-sectional structure similar to the cross-sectional structure of the first embodiment can be obtained. Therefore, effects similar to the effects of the first embodiment can be obtained.

Third Embodiment

A third embodiment will be described. The present embodiment is also similar to the first embodiment except that the planar layout of the GGMOS 100 is changed as compared with the first embodiment, and therefore only the portions different from the first embodiment will be described.

Figure 6:
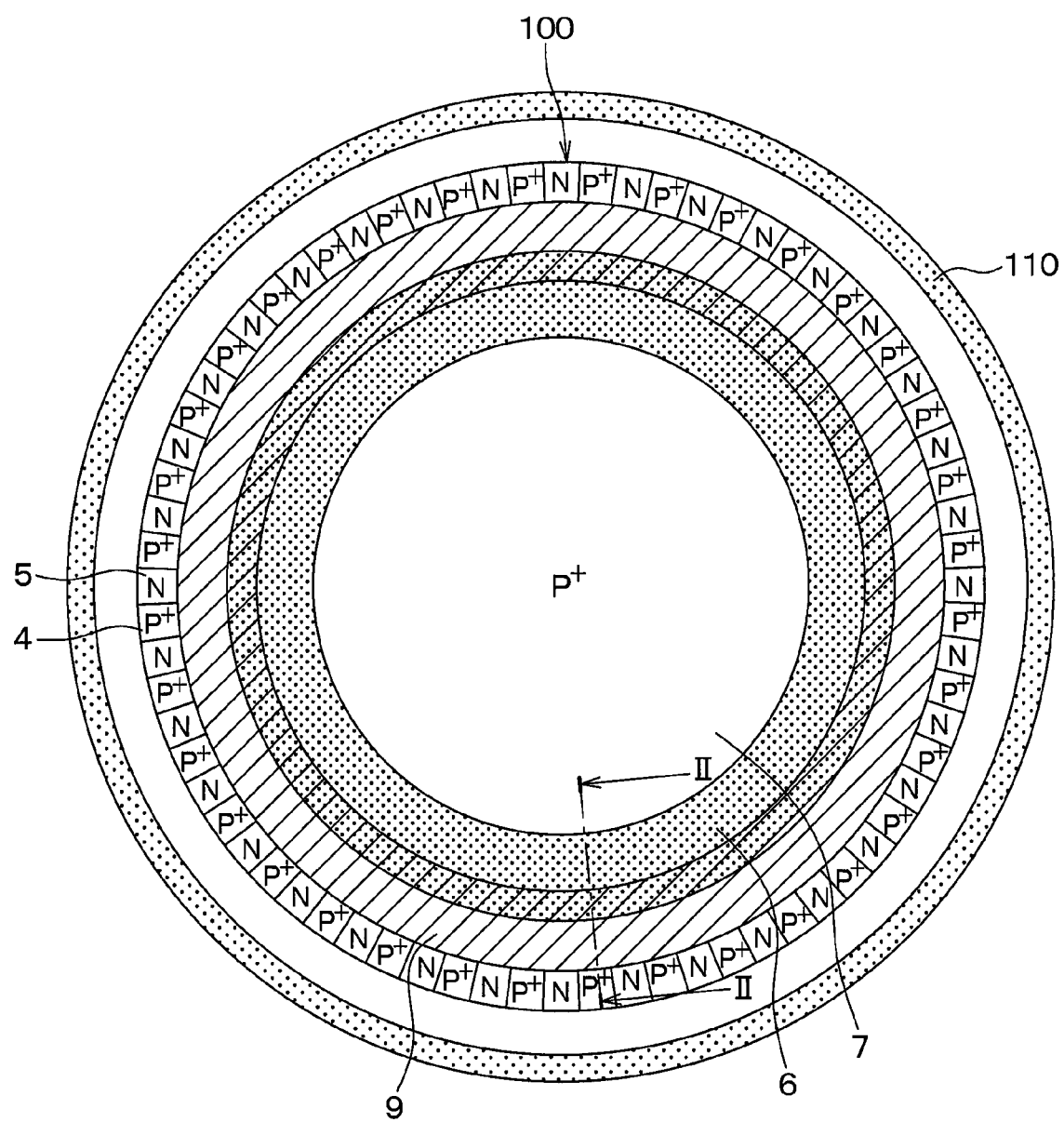
FIG. 6 is a diagram showing a planar layout of a semiconductor device including a GGMOS according to a third embodiment.

As shown in FIG. 6, according to the present embodiment, a P$^+$-type anode region 7 is formed in a circular shape. Also, although not shown in FIG. 6, a P-type well layer 3 has a circular shape disposed concentrically around the P$^+$-type anode region 7, and an N-type well layer 2 is formed around the P-type well layer 3. Further, the N-type well layer 2, an insulating film 6, and a gate electrode 9 are disposed so as to surround the P$^+$-type anode region 7. Further, the N-type body regions 5 and the P$^+$-type cathode regions 4 are alternately disposed so as to surround a periphery of the gate electrode 9. In this manner, the respective components are arranged in concentric circular shapes with the P$^+$-type anode region 7 as a center. With the configuration described above, a semiconductor device having a GGMOS 100 of a concentric circular structure is formed. A cross-sectional view taken along a line II-II in FIG. 6 is similar to the cross-sectional view shown in FIG. 2.

As described above, even in the GGMOS 100 of the planar layout in which the respective components are concentrically arranged with the P$^+$-type anode region 7 as the center, the cross-sectional structure similar to the cross-sectional structure of the first embodiment can be obtained. Therefore, effects similar to the effects of the first embodiment can be obtained.

Fourth Embodiment

A fourth embodiment will be described. The present embodiment is obtained by changing the configuration of the body contact resistance in the first to third embodiments, and the other configuration is similar to the first to third embodiments, and therefore only the portions different from the first to third embodiments will be described.

Figure 7:
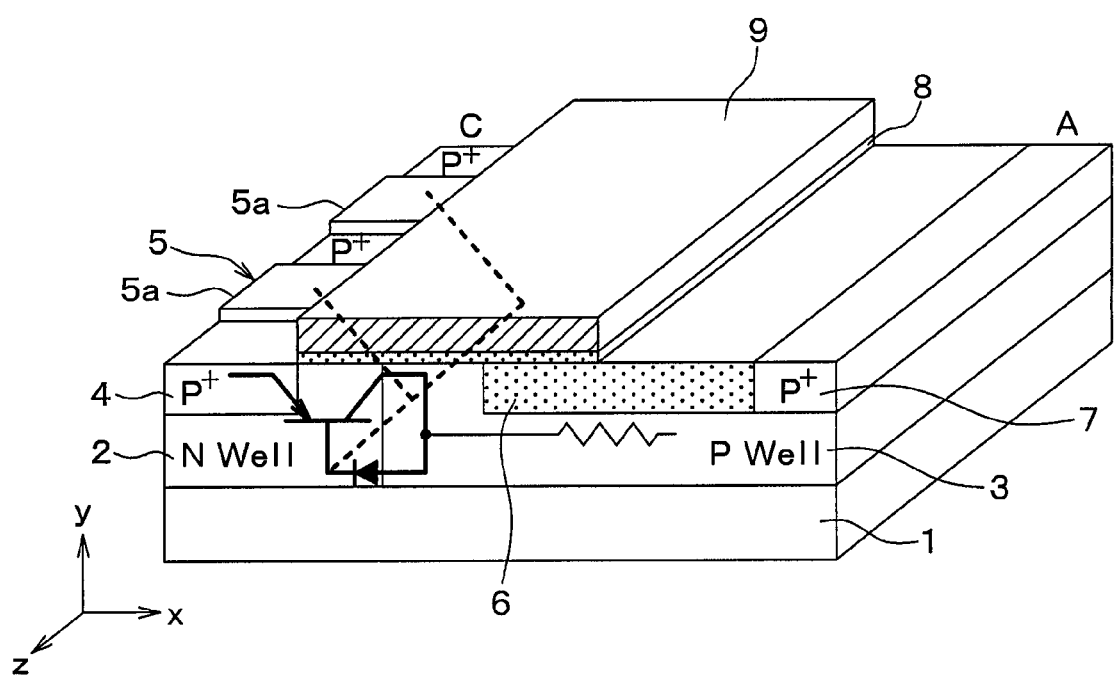
FIG. 7 is a cross-sectional perspective view of a semiconductor device including a GGMOS according to a fourth embodiment.

As shown in FIG. 7, according to the present embodiment, N-type high resistance layers 5a are provided in N-type body regions 5. The N-type body regions 5 may be configured by only the N-type high resistance layers 5a and an N-type well layer 2 may be formed below the N-type high resistance layers 5a, or high concentration N-type layers, which is not shown, may be formed below the N-type high resistance layer 5a.

For example, the N-type high resistance layers 5a are formed of a high resistance polysilicon layer or a high resistance silicide layer. For example, an N-type impurity concentration of the N-type high resistance layers 5a is set so that the N-type high resistance layer 5a is brought in Schottky contact with the cathode electrode 11.

As described above, even if the N-type high resistance layers 5a are provided in the N-type body regions 5, the body contact resistance can be increased. Thus, effects similar to the effects of the first embodiment can be obtained.

Basically, the same manufacturing method as the conventional method can be applied to the method of manufacturing the GGMOS 100 having such a structure, but the N-type high-resistance layers 5a are formed at the same time in a step of forming the gate electrode 9. Specifically, after impurity regions other than the N-type high-resistance layers 5a are formed in the GGMOS 100, the gate insulating film 8 is formed, and then the following steps are performed. First, the gate insulating film 8 is patterned, and the gate insulating film 8 is opened in regions where the N-type body regions 5 are to be formed. Next, after a polysilicon film is formed, N-type impurities are ion-implanted into a position where the gate electrode 9 is to be formed and the positions where the N-type body regions 5 are to be formed. However, the amount of N-type impurities implanted into the gate electrode 9 and the N-type body regions 5 is different from each other, and the amount of N-type impurity implanted into the N-type body regions 5 is smaller than the amount of N-type impurity implanted into the gate electrode 9. Thus, ion implantation is performed in order in each region by selectively performing ion implantation using a mask (not shown). Thereafter, polysilicon is patterned to form the gate electrode 9 and the N-type body regions 5 at the same time. After that, a step of forming the interlayer insulating film 10, a step of forming the contact hole, and a step of forming the cathode electrode 11 and the anode electrode 12 are performed as in the conventional case to manufacture the GGMOS 100 according to the present embodiment.

Other Embodiments

Although the present disclosure has been described in accordance with the embodiments described above, the present disclosure is not limited to the embodiments described above, and encompasses various modifications and variations within the scope of equivalents. In addition, various combinations and configurations, as well as other combinations and configurations that include only one element, more, or less, are within the scope and spirit of the present disclosure.

For example, in each of the embodiments described above, it is needless to say that the elements configuring the embodiments are not necessarily essential except in the case where the elements are clearly indicated that the elements are particularly essential, the case where the elements are considered to be obviously essential in principle, and the like. Further, in each of the embodiments described above, when numerical values such as the number, numerical value, quantity, range, and the like of the components of the embodiment are referred to, except in the case where the values are expressly indispensable in particular, the case where the values are obviously limited to a specific number in principle, and the like, the present disclosure is not limited to the specific number. Further, in each of the embodiments described above, when referring to the shape, positional relationship, and the like of the components and the like, it is not limited to the shape, positional relationship, and the like, except for the case where the components are specifically specified, the case where the components are fundamentally limited to a specific shape, positional relationship, and the like.

In the above embodiments, the GGMOS 100 is formed using a P-channel-type LDMOS in which the first conductivity type is an N-type and the second conductivity type is a P-type. However, this is merely an example, and the GGMOS 100 may be configured using an N-channel-type LDMOS in which the first conductivity type is P-type and the second conductivity type is N-type.

What is claimed is:

1. A semiconductor device configuring a protection element, comprising:
  a semiconductor substrate having a first conductivity type well layer and a second conductivity type well layer being in contact with each other;
  a cathode region disposed at a position away from a PN junction configured by the first conductivity type well layer and the second conductivity type well layer in a surface layer portion of the first conductivity type well layer, and having a second conductivity type impurity concentration higher than a second conductivity type impurity concentration of the second conductivity type well layer;
  a plurality of body regions of a first conductivity type disposed at a plurality of positions different from the cathode region in the surface layer portion of the first conductivity type well layer;
  an anode region disposed at a position away from the PN junction in a surface layer portion of the second conductivity type well layer, and having a second conductivity type impurity concentration higher than the second conductivity type impurity concentration of the second conductivity type well layer;
  a gate insulating film disposed on a surface of a portion of the second conductivity type well layer located between the cathode region and the anode region;
  a gate electrode disposed on the gate insulating film;
  a cathode electrode electrically connected to the cathode region and electrically connected to the first conductivity type well layer through the plurality of body regions; and
  an anode electrode electrically connected to the anode region, wherein
  the protection element is configured to protect a protection target element connected between the cathode electrode and the anode electrode when a parasitic transistor configured by the cathode region, the first conductivity type well layer, and the second conductivity type well is turned on and electrical continuity is established between the cathode electrode and the anode electrode, and
  the plurality of body regions is disposed in one cell of the protection element and is brought in Schottky contact with the cathode electrode.

2. The semiconductor device according to claim 1, wherein
  the first conductivity type well layer and the second conductivity type well layer have linear portions extending in one direction parallel to a surface of the semiconductor substrate, and a boundary line of the PN junction has a linear portion along the one direction,
  the cathode region is one of a plurality of cathode regions,
  the plurality of the cathode regions and the plurality of the body regions are aligned along the one direction, and
  the anode region extends along the one direction.

3. The semiconductor device according to claim 1, wherein
  at least one of the first conductivity type well layer and the second conductivity type well layer is formed in a mesh pattern, and the other of the first conductivity type well layer and the second conductivity type well layer is formed at positions of meshes of the mesh pattern,
  the cathode region is one of a plurality of cathode regions,
  the anode region is one of a plurality of anode regions,
  the plurality of the cathode regions and the plurality of the body regions are disposed in a lattice pattern at a position where the first conductivity type well layer is formed, and
  the plurality of the anode regions is disposed in a lattice pattern at a position where the second conductivity type well layer is formed.

4. The semiconductor device according to claim 1, wherein
  the anode region has a circular shape,
  the second conductivity type well layer has a circular shape disposed concentrically around the anode region,
  the first conductivity type well layer is disposed concentrically with the anode region as a center,
  the cathode region is one of a plurality of cathode regions, and
  the plurality of the cathode regions and the plurality of the body regions are alternately disposed in a circular shape to surround the anode region.

5. A semiconductor device configuring a protection element, comprising:
  a semiconductor substrate having a first conductivity type well layer and a second conductivity type well layer being in contact with each other;
  a cathode region disposed at a position away from a PN junction configured by the first conductivity type well layer and the second conductivity type well layer in a surface layer portion of the first conductivity type well layer, and having a second conductivity type impurity concentration higher than a second conductivity type impurity concentration of the second conductivity type well layer;
  a plurality of body regions of a first conductivity type disposed at a plurality of positions different from the cathode region in the surface layer portion of the first conductivity type well layer;
  an anode region disposed at a position away from the PN junction in the surface layer portion of the second conductivity type well layer and having the second conductivity type impurity concentration higher than the second conductivity type impurity concentration of the second conductivity type well layer;
  a gate insulating film disposed on a surface of a portion of the second conductivity type well layer located between the cathode region and the anode region;
  a gate electrode disposed on the gate insulating film;
  a cathode electrode electrically connected to the cathode region and electrically connected to the first conductivity type well layer through the plurality of body regions; and
  an anode electrode electrically connected to the anode region, wherein
  the protection element is configured to protect a protection target element connected between the cathode electrode and the anode electrode when a parasitic transistor configured by the cathode region, the first conductivity type well layer, and the second conductivity type well is turned on, and electrical continuity is established between the cathode electrode and the anode electrode, the plurality of body regions is disposed in one cell of the protection element, and each of the plurality of the body regions includes a high resistance layer of the first conductivity type, and the high resistance layer is disposed at a position above the first conductivity type well layer, is higher in resistance than the first conductivity type well layer, and is brought in contact with the cathode electrode.

6. The semiconductor device according to claim 5, wherein
the high resistance layer is a high resistance polysilicon layer or a high resistance silicide layer.

7. The semiconductor device according to claim 5, wherein
the first conductivity type well layer and the second conductivity type well layer have linear portions extending in one direction parallel to a surface of the semiconductor substrate, and a boundary line of the PN junction has a linear portion along the one direction,
the cathode region is one of a plurality of cathode regions,
the plurality of the cathode regions and the plurality of the body regions are aligned along the one direction, and
the anode region extends along the one direction.

8. The semiconductor device according to claim 5, wherein
at least one of the first conductivity type well layer and the second conductivity type well layer is formed in a mesh pattern, and the other of the first conductivity type well layer and the second conductivity type well layer is formed at positions of meshes of the mesh pattern,
the cathode region is one of a plurality of cathode regions,
the anode region is one of a plurality of anode regions,
the plurality of the cathode regions and the plurality of the body regions are disposed in a lattice pattern at a position where the first conductivity type well layer is formed, and
the plurality of the anode regions is disposed in a lattice pattern at a position where the second conductivity type well layer is formed.

9. The semiconductor device according to claim 5, wherein
the anode region has a circular shape,
the second conductivity type well layer has a circular shape disposed concentrically around the anode region,
the first conductivity type well layer is disposed concentrically with the anode region as a center,
the cathode region is one of a plurality of cathode regions, and
the plurality of the cathode regions and the plurality of the body regions are alternately disposed in a circular shape to surround the anode region.

* * * * *